United States Patent [19]
Meldrum et al.

[11] Patent Number: 5,227,984
[45] Date of Patent: Jul. 13, 1993

[54] INSTRUMENT WITH CONTINUITY CAPTURE FEATURE

[75] Inventors: Glen A. Meldrum, Bothell; Alan W. McRobert; Robert M. Greenberg, both of Marysville, all of Wash.

[73] Assignee: John Fluke Mfg. Co., Inc., Everett, Wash.

[21] Appl. No.: 666,254

[22] Filed: Mar. 8, 1991

[51] Int. Cl.$^5$ .............................. G01R 31/02
[52] U.S. Cl. ..................... 364/550; 324/522; 340/652; 364/580
[58] Field of Search ............. 324/113, 522, 523; 340/651, 652, 653; 364/550, 580

[56] References Cited

U.S. PATENT DOCUMENTS

| | | | |
|---|---|---|---|
| Re. 31,606 | 6/1984 | Crosby | 324/99 D X |
| 2,950,437 | 8/1960 | Stahl | 364/580 X |
| 3,699,569 | 10/1972 | Lee | 340/651 X |
| 4,224,690 | 9/1980 | Rockwell | 364/580 X |
| 4,228,394 | 10/1980 | Crosby | 324/99 D X |
| 4,400,783 | 8/1983 | Locke, Jr. et al. | 324/113 X |
| 4,689,551 | 8/1987 | Ryan et al. | 324/66 X |
| 4,804,908 | 2/1989 | Mitchell | 324/115 |
| 4,862,142 | 8/1989 | Knight | 340/522 |

*Primary Examiner*—Edward R. Cosimano
*Attorney, Agent, or Firm*—Richard A. Koske

[57] ABSTRACT

An instrument having a continuity test feature wherein a change in continuity state from open-to-short or short-to-open is captured and displayed. A comparator provides continuity state information for a circuit under test. A storage device receives the state information and provides logic indicative of the continuity state which is read by a controller that executes a continuity capture program initiated by keypad or function selector input. A first transition between different continuity states is captured during a present capture cycle and is displayed in a form indicative of the type of transition captured. Subsequent transitions during the present capture cycle are ignored.

7 Claims, 6 Drawing Sheets

INSTRUMENT WITH CONTINUITY CAPTURE FEATURE

BACKGROUND OF THE INVENTION

The present invention relates generally to instruments for measuring electrical parameters and, more particularly, to instruments, and methods employed thereby, capable of measuring continuity in an electric circuit.

Conventional techniques for troubleshooting electric circuits include making continuity tests of the circuit in which open circuit and short circuit conditions are detected. One of the simplest devices for testing continuity consists of a flashlight having a test lead. To test continuity of a conductor, for example, one end of the conductor is connected to ground and the other end is connected to the test lead. Continuity is verified when the flashlight lights. Variations of this technique include a buzzer for audible feedback confirming continuity. One drawback to this type of continuity tester is that it may not respond to fast, intermittent changes in continuity. Also, if a person using the flashlight device is not within sight or earshot of the device, that person will not detect an intermittent change in circuit continuity even though the flashlight may have responded thereto.

Another type of continuity tester includes an instrument that measures the impedance of the circuit being tested and provides a display of the impedance value. With this type of instrument, high values are indicative of open circuits and low values indicate short circuits, while intermediate values may indicate other conditions, such as the presence of poor connections in the circuit being tested. However, as with other types of prior art continuity testers, these instruments may not respond to very fast, intermittent changes in circuit continuity state. Rather, the impedance value displayed on the instrument simply represents the impedance of the circuit before or after the intermittent change. Since the instrument does not capture or display the change, a person using the instrument cannot detect the nature of the change after it has occurred. In addition, if the intermittent change is faster than the response time of the instrument's display, the change will not be detected even if the person is viewing the display when the intermittent change occurs.

Yet another type of prior art device includes conventional logic analyzers, which are high speed devices that detect and record logic changes in circuits. Continuity changes in a circuit may be thought of as logic level changes that could be detected by a logic analyzer. However, as a practical matter these devices are too sophisticated, and as a result, are too complex and expensive to be used for continuity testing. In addition, most logic analyzers are too cumbersome to be carried around for general purpose continuity testing.

Accordingly, there is a need for an instrument capable of capturing intermittent changes in continuity of an electric circuit and displaying these changes in such a way that the displays are indicative of the nature of the changes. The instrument should also be relatively inexpensive and portable so as to facilitate its use as a trouble-shooting aid. The present invention is directed to a instrument having a continuity capture feature, and a method employed thereby, designed to achieve these results.

SUMMARY OF THE INVENTION

In accordance with the present invention an instrument that senses continuity status in an electric circuit under test and captures transitions in the continuity state is provided. The instrument includes a controller that receives continuity status information and provides output information indicative of the nature of the continuity state. The controller processes the information to determine if a transition in continuity state has occurred and, if a transition has occurred, captures that transition and provides output data indicative of the type of transition captured.

In accordance with further aspects of the present invention, the instrument includes a comparator that provides the continuity state information to storage devices that remember if the continuity state reached a short condition or open condition during a capture cycle of the controller. The controller captures a first transition occurring during a capture cycle and causes the first transition captured to be displayed while subsequent transitions occurring during the capture cycle are ignored.

In accordance with still further aspects of the present invention the instrument is a multimeter capable of performing different measurement functions on various electrical parameters. A function selector for activating the different measurement functions is also operative to initiate the capture cycle.

In accordance with the present invention, a method for detecting changes in continuity of an electric circuit includes the steps of: sensing a first continuity state of the circuit, displaying the first continuity state, sensing a second continuity state of the circuit, comparing the first and second states and determining if a transition has occurred if the first and second continuity states are different, and displaying the transition in a form indicative of the type of transition captured.

In accordance with further aspects of the present invention, the method further includes the steps of: initiating a capture cycle, capturing a first transition in continuity state occurring during the capture cycle, and ignoring subsequent transitions occurring during the capture cycle.

As will be appreciated from the foregoing summary, the present invention provides a continuity test instrument for capturing transitions in the continuity state of a circuit under test as well as a method to accomplish the same.

BRIEF DESCRIPTION OF THE DRAWINGS

The foregoing and other features of this invention will become more readily appreciated as the same becomes better understood by reference to the following detailed description taken in conjunction with the accompanying drawings, wherein.

DETAILED DESCRIPTION OF THE PREFERRED EMBODIMENT

Figure 1:
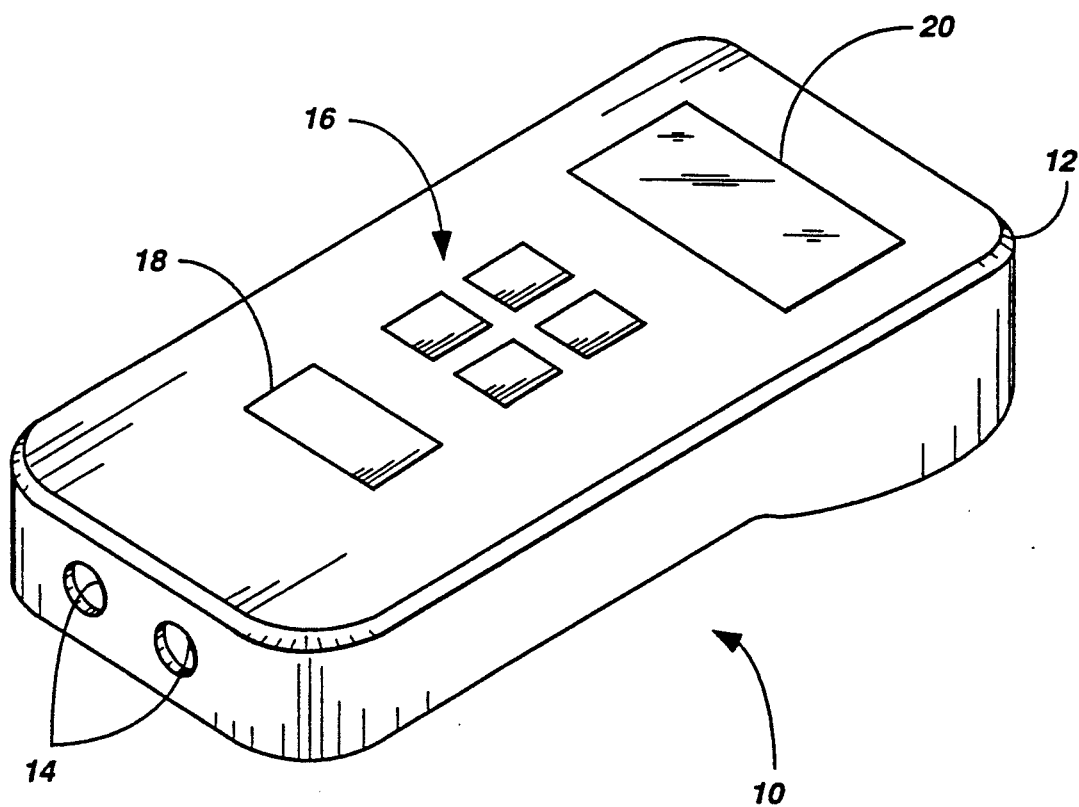
FIG. 1 is an isometric view of a handheld multimeter having a continuity measurement function in accordance with a preferred embodiment of the present invention.

Referring now to FIG. 1, there is depicted an isometric view of an instrument 10 formed in accordance with the invention. One example of a suitable instrument 10 is a handheld digital multimeter. Instrument 10 includes a case 12 with input connectors 14 extending to one end thereof and which connect to test leads (not shown) for coupling the instrument 10 to a circuit under test (also not shown). Centrally disposed along the top face of the instrument 10 is a key pad 16, comprising four keys in the illustrated embodiment. A function selector 18, which serves to allow the instrument operator to choose various instrument functions, is located on the top face of the instrument adjacent the key pad and comprises, for example, a multiple position slide switch. On the opposite side of the keypad 16 from the selector switch 18 is a display 20, which may comprise, for example, a liquid crystal display. Incorporated within instrument is alarm 29 (not shown in FIG. 1).

Figure 2:
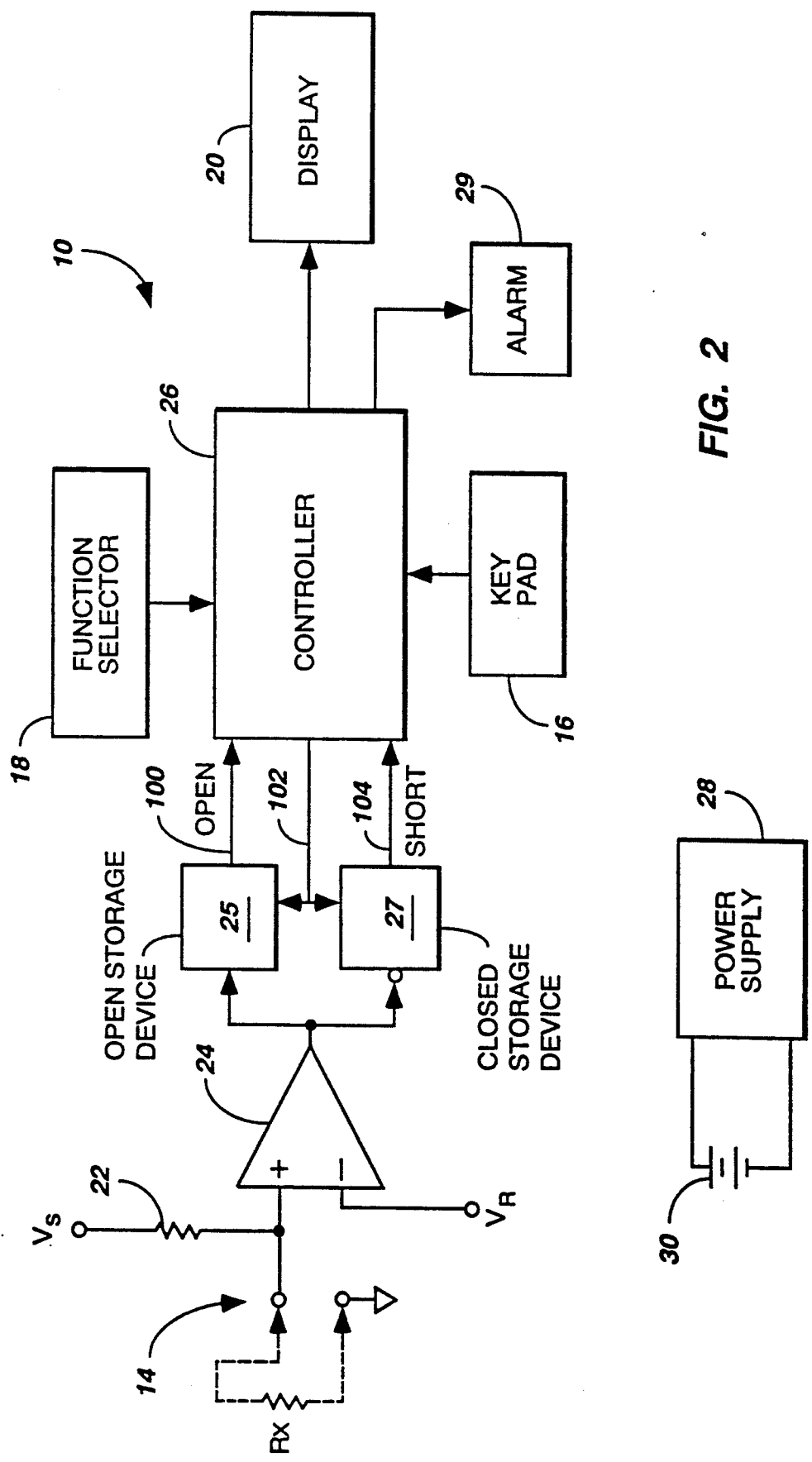
FIG. 2 is a partial block diagram of the multimeter of FIG. 1.

Referring next to FIG. 2, there is depicted a combined schematic and block diagram illustrating important features of the instrument 10 in accordance with a preferred embodiment of the present invention. A circuit being tested for continuity is coupled to input terminals 14 and is schematically represented as a resistance, $R_X$, connected to the input terminals 14 by dashed lines. One instrument input terminal 14 is grounded while the other is coupled to the noninverting input of comparator 24 and through current limiting resistor 22 to source voltage, $V_S$. Comparator 24 has its inverting input coupled to reference voltage, $V_R$. The output of comparator 24 is coupled to a pair of storage devices 25 and 27, and more particularly, to a noninverting input of storage device 25 and to an inverting input of storage device 27. Storage devices 25 and 27 are preferably RS-type flip flops, however, other resettable storage devices may be equally well suited. As will be discussed more fully below, comparator 24 provides storage devices 25 and 27 with continuity state information for the circuit under test ($R_X$). Storage device (hereinafter open storage device) 25 stores "open" continuity state information, that is, information indicative of an open condition in the circuit under test. Storage device (hereinafter short storage device) 27 stores "short" continuity state information, that is, information indicative of a short condition in the circuit under test. The outputs of the open and short storage devices 25 and 27 are coupled via lines 100 and 104 to a controller 26, which also provides a reset signal to the storage devices via line 102. In addition, controller 26 receives input information from key pad 16 as well as function selector 18 that are operative to control various functions of the instrument 10 including initiating a continuity capture cycle in which the controller 26 captures a first transition in the continuity state of the circuit being tested. Preferably, controller supplies data to alarm 29 for generating an alarm signal during operation, wherein the alarm signal may comprise an audible tone. Controller 26 further supplies display data to display 20 in order to provide visual readout of continuity state information. Power supply 28, including battery 30, supplies power to the various circuits of the instrument 10 (connections not shown).

As noted above, the output of comparator 24 provides storage devices 25 and 27 with continuity state information for the circuit under test ($R_X$). More specifically, high and low states of comparator 24 produces high and low outputs indicative of open and short continuity states of the circuit under test. That is, a high $R_X$ value representing an open continuity state of the circuit under test causes the state of comparator 24 to be high, and a low $R_X$ value representing a closed, or shorted, continuity state causes the comparator 24 to be in the low state. Open storage device 25 and short storage device 27 store the continuity state information provided by comparator 24. The logic output of open storage device 25 is set high when the output of comparator 24 is high, indicating an open continuity state in the circuit under test, and remains high until the open storage device is reset by controller 26. Similarly, the logic output of short storage device 27 is set high when the output of comparator 26 is low, indicating a short continuity state in the circuit under test, and remains high until the short storage device is reset by controller 26.

As will be more fully explained below, controller 26 executes a capture program that allows the controller to detect and capture transitions in continuity states for the circuit under test ($R_X$) by reading the outputs of storage devices 25 and 27, and generating an output to display 20 indicative of the transition. More specifically, when the continuity state of the circuit under test changes from "open" to "short", comparator 24 changes from a high to low state, the output of short storage device 27 goes high, and controller 26 produces display data that causes display 20 to generate a display indicative of the open-to-short transition. Likewise, if the continuity state of the circuit under test changes from "short" to "open", comparator 24 changes from a low to high state, the output of open storage device 25 goes high, and the controller 26 produces display data that causes display 20 to generate a display indicative of the short-to-open transition. The capture program instructs the controller 26 to detect the first transition occurring after the program is initiated and to ignore subsequent transitions until the program is restarted, that is to say, during a capture cycle only the first transition in continuity state is captured and displayed.

Figure 3:
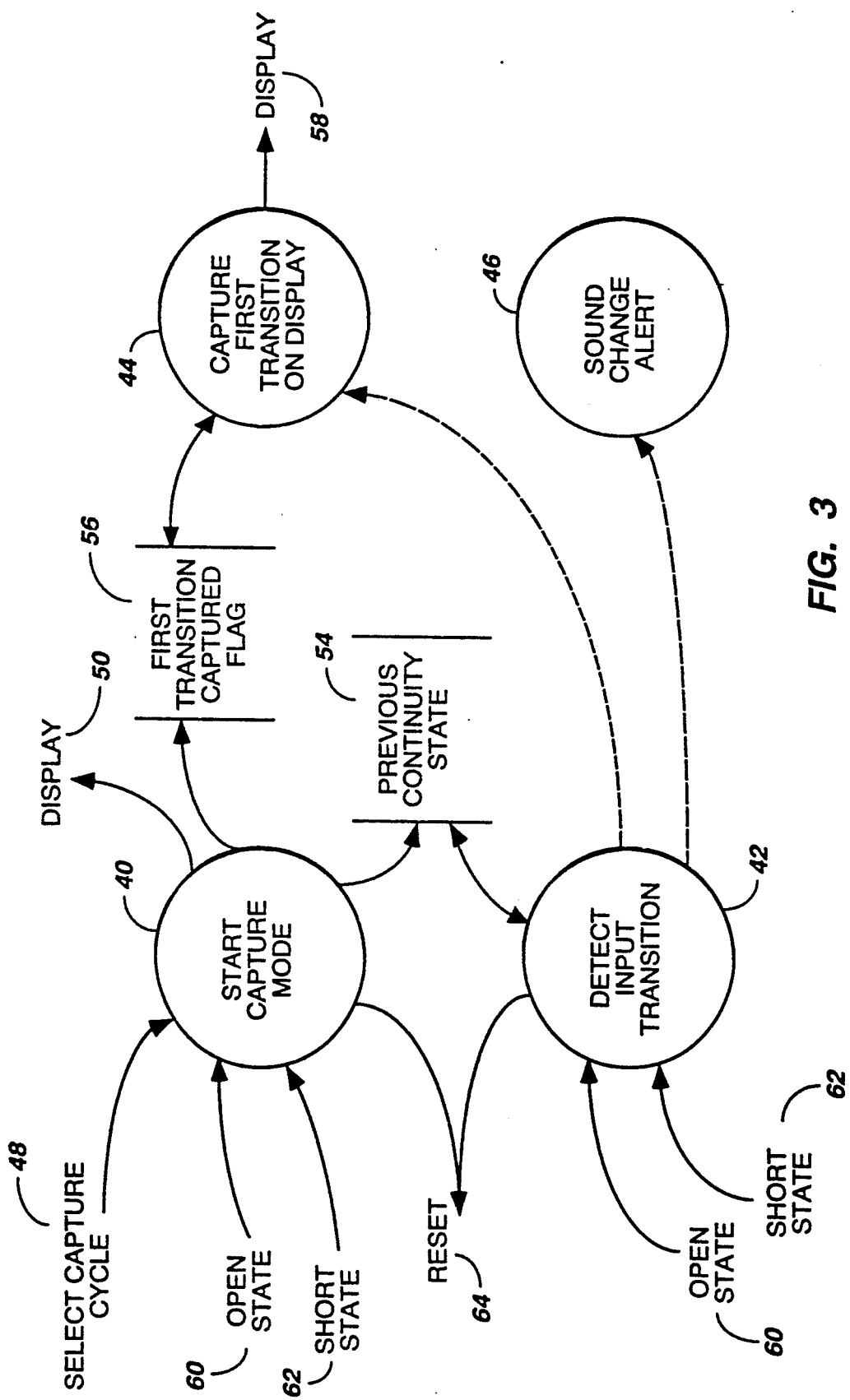
FIG. 3 is a data flow and control flow diagram of a continuity capture program executed by the multimeter in FIG. 2.

Turning next to FIG. 3, there is depicted a data flow and control flow diagram for the capture program executed by controller 26 during a capture cycle. Basically, the capture program includes a start capture mode process 40, a detect input transition process 42, and a capture first transition process 44. These processes will be discussed more fully below. In addition, a sound change alert process 46 may be executed by the capture program, however it is not necessarily a part of the present invention.

The start capture mode process 40 is initiated when a capture cycle 48 is selected via keypad 16 or function selector 18 (FIG. 2). The start capture mode process 40 receives the outputs, i.e., open state 60 and short state 62, of storage devices 25 and 27 and initializes display 50 as well as previous continuity state 54 to reflect the present continuity state. The start capture mode process also sets a first transition captured flag 56. The detect input transition process 42 determines if a transition in continuity (from short-to-open or open-to-short) has occurred by detecting a difference between open state 60 or short state 62 and previous continuity state 54. When a transition has been detected, previous continuity state 54 is updated and if it is the first transition since the capture cycle was selected, capture first transition on display process 44 produces display data 58 causing the first transition to be shown on display 20 (FIG. 2). In addition, sound change alert process 46 may be activated to sound an alarm indicating the occurrence of a change (i.e., transition) in continuity states.

Figure 4:
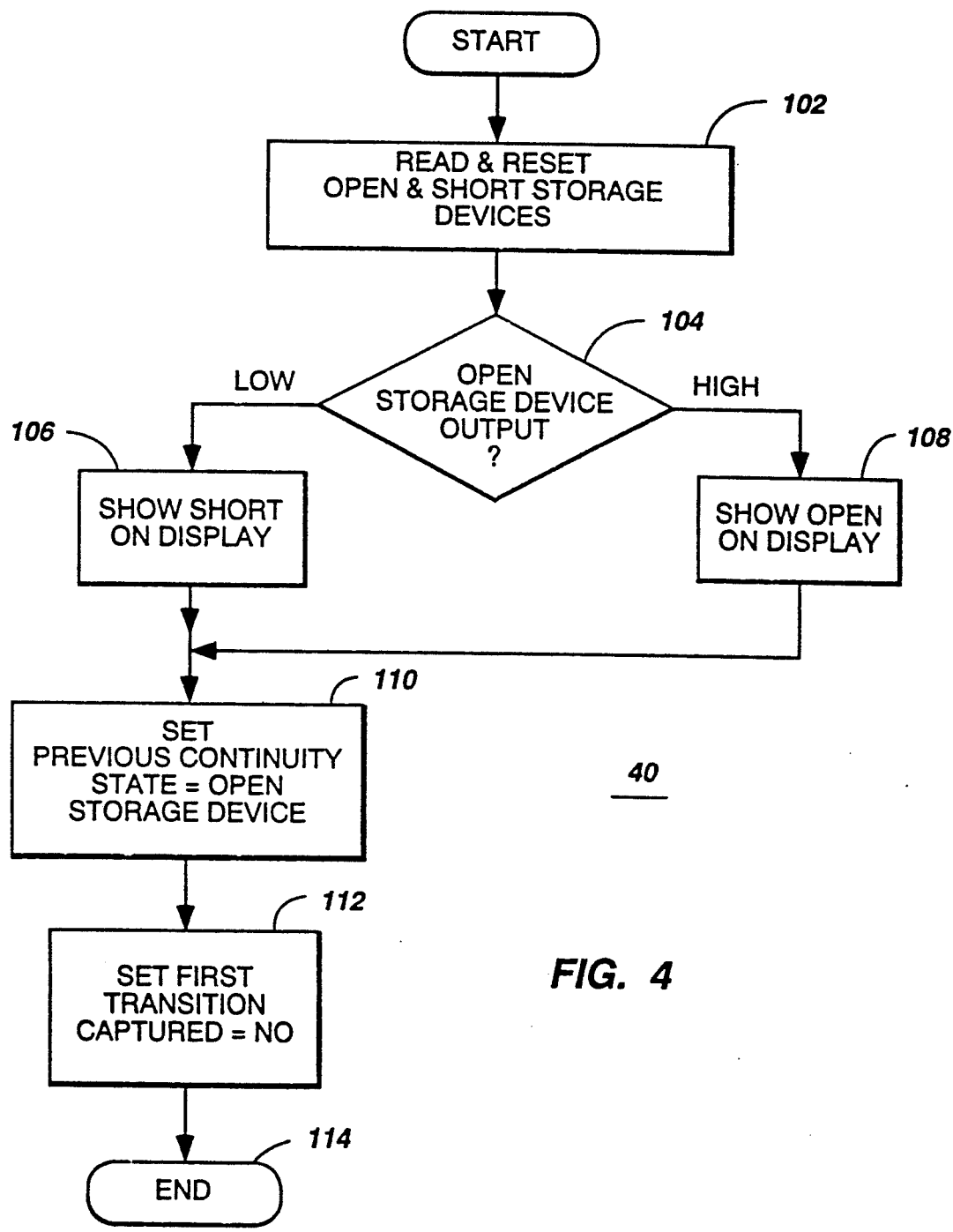
FIG. 4 is a flow chart of a start capture mode process of the program illustrated in FIG. 3.

FIG. 4 illustrates functional steps of the start capture mode process (Step 40) of the capture program in accordance with the present invention. As noted above, operation of the keypad 16 or function selector 18 initiates a capture cycle via this process. The program instructs controller 26 to read and reset open and short storage devices 25 and 27 (Step 102). The continuity state of the circuit under test is determined from the logic output of open storage device 25 (Step 104). A low output indicates a short circuit continuity state and causes the program to instruct controller 26 to generate a display indicative of the short circuit continuity state (Step 106). A high output indicates an open circuit continuity state and causes the program to instruct controller 26 to generate a display indicative of the open circuit continuity state (Step 108). Next, previous continuity state is set equal to the state indicated by the output of open storage device 25 (Step 110) and a first transition capture flag is set equal to "NO" (Step 112), indicating that a first transition has not been detected during the present capture cycle. After the flag has been set the start capture mode process ends (Step 114).

Figure 5:
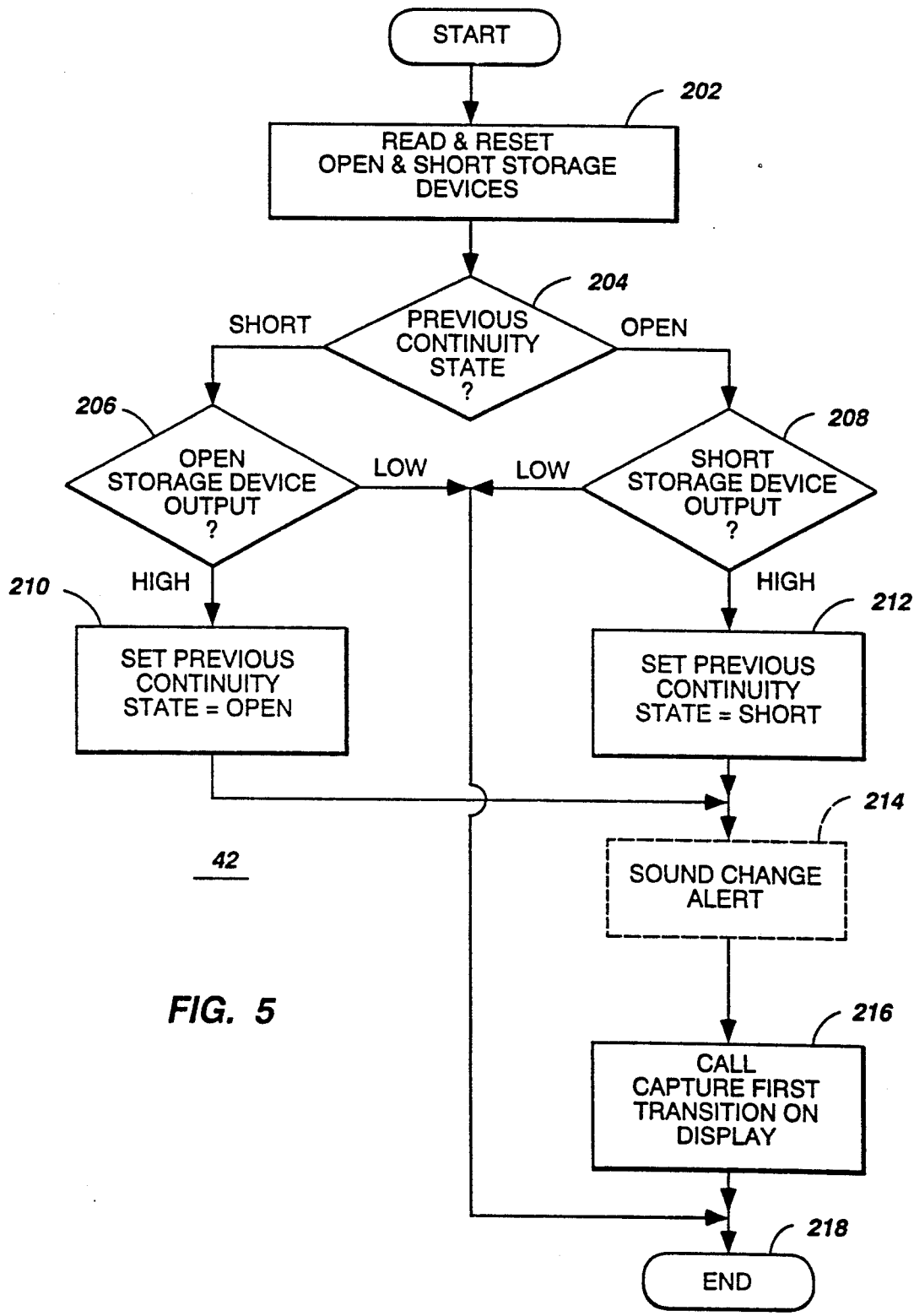
FIG. 5 is a flow chart of a detect input transitions process of the program illustrated in FIG. 3.

Depicted in FIG. 5, are functional steps of the detect input transition process (Step 42) in accordance with the present invention. The program instructs the controller to read and reset open and short storage devices 25 and 27 (Step 202), and determine previous continuity state (Step 204). If previous continuity state is short, the program looks to the open storage device to determine if an input transition has occurred (Step 206). If previous continuity state is open, the program looks to the short storage device to determine if an input transition has occurred (Step 208). A low output from the either storage device indicates that a transition has not occurred and the process ends (Step 218). On the other hand, a high output from open storage device 25 (when previous continuity state is short) indicates a short-to-open transition and previous continuity state is set to open (Step 210). Likewise, a high output from short storage device 27 (when previous continuity state is open) indicates an open-to-short transition and previous continuity state is set to short (Step 212). Once previous continuity has been set, a change alert may be sounded (Step 214) using alarm 29 and the capture first transition on display process is called (Step 216), thus ending the detect input transition process (Step 218).

Figure 6:
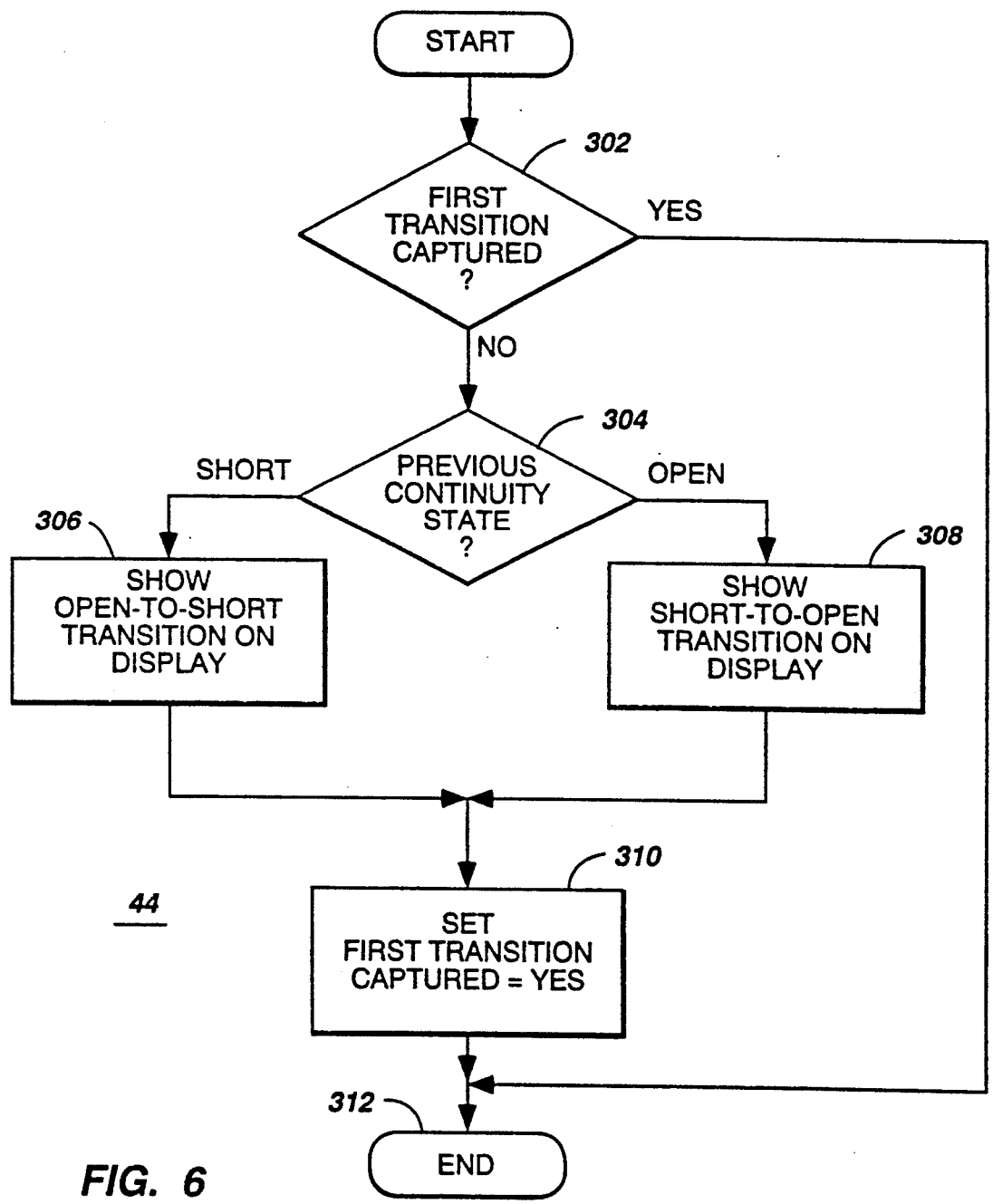
FIG. 6 is a flow chart of a capture first transition process of the program illustrated in FIG. 3.

FIG. 6 illustrates functional steps of the capture first transition on display process (Step 44) in accordance with the present invention, whereby first transition captured flag is accessed (Step 302). If an input transition has already been detected during the present capture cycle (i.e., if flag=YES), this process ends (Step 312). If an input transition has not been previously detected during the present capture cycle (i.e., if flag=NO), the program proceeds to determine the nature of the first transition detected (Step 304). If previous continuity state indicated a short in the circuit under test, then there was an open-to-short transition, whereas, if previous continuity state indicated an open in the circuit under test, there was a short-to-open transition. In any event, display 20 shows the appropriate open-to-short (Step 306) or short-to-open (Step 308) transition. Finally, since a first input transition has been detected and captured during the present capture cycle, the first transition captured flag is set to "YES" and subsequent transitions occurring during the present capture cycle are ignored (Step 310).

While a preferred embodiment of the present invention has been illustrated and discussed, it is to be understood that variations may be made other than as described above without departing from the spirit and scope of the present invention. For example, display 20 may be a printer that provides a hard copy of the captured transition or it may be in the form of memory in which the transition information can be stored for later retrieval, in which case the first captured flag may be omitted so that each transition is captured. Use of the storage devices allows the capture of transitions, or glitches, having approximate durations of only 1–50 $\mu$sec. If, however, it is not desirable to be able to capture very fast transitions, the storage devices may be omitted and the output of the comparator coupled directly to the controller. Consequently, the present invention can be practiced otherwise than as specifically described herein.

We claim:

1. An instrument for sensing changes in continuity comprising:
   (a) input means for receiving continuity information from an electric circuit under test;
   (b) a comparator coupled to said input means for comparing said continuity information with a reference and producing a first output state representative of one of a short circuit condition and an open circuit condition in the electric circuit under test and subsequently producing a second output state representative of another of said short circuit condition and said open circuit condition for the same point in said electric circuit under test;
   (c) data storage means coupled to said comparator for receiving and storing said first output state of said comparator and producing a first continuity status output, and for receiving said second output state of said comparator subsequent in time to said first output state and producing a second continuity status output; and
   (d) processing means coupled to said data storage means for processing said first and second continuity status outputs of said data storage means to determine if a change in continuity status has occurred, indicating one of a short circuit-to-open circuit transition and an open circuit-to-short circuit transition and, if such a change in continuity status has occurred, capture said change and provide output data indicative of said one of said open-to-short transition and said short-to-open transition.

2. The instrument according to claim 1, wherein said instrument further comprises a display coupled to receive said output data of said processing means and produce a display indicative of said one of said open-to-short transition and said short-to-open transition.

3. An instrument for sensing changes in continuity comprising:
   (a) input means for receiving continuity information from an electric circuit under test;

(b) a comparator coupled to said input means for comparing said continuity information with a reference and producing a first output state representative of one of a short circuit condition and an open circuit condition in the electric circuit under test and subsequently producing a second output state representative of another of said short circuit condition and said open circuit condition for the same point in said electric circuit under test;

(c) data storage means coupled to said comparator for receiving and storing said first output state of said comparator and producing a first continuity status output, and for receiving said second output state of said comparator subsequent in time to said first output state and producing a second continuity status output;

(d) means for initiating a continuity capture cycle; and (e) a controller coupled to said data storage means for processing said first and second continuity status outputs of said storage means to determine if a change in continuity status has occurred during said capture cycle, indicating one of a short circuit-to-open circuit transition and an open circuit-to-short circuit transition and, if said change is the first change in continuity status detected during said capture cycle, capturing said first change and providing output data indicative of said one of said open-to-short transition and said short-to-open transition.

4. The instrument of claim 3, wherein said means for initiating a continuity capture cycle includes a function selector.

5. The instrument of claim 4, wherein said instrument further comprises a display coupled to receive said output data of said controller and produce a display indicative of said one of said open-to-short transition and said short-to-open transition.

6. A method for sensing and capturing changes in continuity of an electric circuit comprising the steps of:
(a) initiating a continuity capture cycle;
(b) sensing a first continuity status of the electric circuit under test, wherein said first continuity status is one of a short circuit condition and an open circuit condition;
(c) sensing a second continuity status of the electric circuit under test subsequent in time to said first continuity status, wherein said second continuity status is another of said short circuit condition and said open circuit condition for the same point in said electric circuit under test;
(d) comparing said first and second continuity statuses and determining that a change in continuity status has occurred when said first and second continuity statuses are different, indicating one of a short circuit-to-open circuit transition and an open circuit-to-short circuit transition; and
(e) capturing said change in continuity status when said change is the first to occur during said continuity capture cycle.

7. The method according to claim 6, further comprising the step of displaying said change in continuity status in a form indicative of said one of said open-to-short transition and said short-to-open transition.

* * * * *